United States Patent
Gong

(10) Patent No.: US 9,043,686 B2
(45) Date of Patent: May 26, 2015

(54) METHOD AND APPARATUS FOR DECODING AND CHECKING TAIL-BITING CONVOLUTIONAL CODE

(75) Inventor: Ming Gong, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 87 days.

(21) Appl. No.: 13/982,557

(22) PCT Filed: Sep. 22, 2011

(86) PCT No.: PCT/CN2011/080060
§ 371 (c)(1),
(2), (4) Date: Sep. 13, 2013

(87) PCT Pub. No.: WO2012/103752
PCT Pub. Date: Aug. 9, 2012

(65) Prior Publication Data
US 2014/0013191 A1  Jan. 9, 2014

(30) Foreign Application Priority Data
Jan. 31, 2011 (CN) .......................... 2011 1 0033627

(51) Int. Cl.
*H03M 13/23* (2006.01)
*H03M 13/09* (2006.01)
(Continued)

(52) U.S. Cl.
CPC .............. *H03M 13/23* (2013.01); *H03M 13/09* (2013.01); *H03M 13/413* (2013.01);
(Continued)

(58) Field of Classification Search
CPC ... H04L 1/0045; H04L 1/0057; H04L 1/0065; H04L 1/005; H04L 1/0066; H04L 1/0059; H04L 1/0054; H04L 1/0061; H04L 1/0071; H04N 21/4382; H03M 13/2972; H03M 13/09; H03M 13/23; H03M 13/413; H03M 13/41; H03M 13/6525; H03M 13/2957
USPC .......... 714/E11.032, 752, 751, 758, 776, 786, 714/781, 265; 375/341, 265, 219
See application file for complete search history.

(56) References Cited

U.S. PATENT DOCUMENTS 5,369,671 A * 11/1994 Yehushua et al. ............. 375/341
7,230,978 B2 * 6/2007 Bitterlich et al. ............. 375/219
(Continued)

FOREIGN PATENT DOCUMENTS

| CN | 1968024 A | 5/2007 |
|---|---|---|
| CN | 101369817 A | 2/2009 |
| JP | 2010226215 A | 10/2010 |

OTHER PUBLICATIONS

International Search Report in international application No. PCT/CN2011/080060, mailed on Nov. 3, 2011 (2 pages—see entire document).
(Continued)

*Primary Examiner* — Phung M Chung
(74) *Attorney, Agent, or Firm* — Oppedahl Patent Law Firm LLC

(57) ABSTRACT

A method for decoding and checking a tail-biting convolutional code is provided. The method fully utilizes structural features of the tail-biting convolutional code to re-sort Log-Likelihood Ratio (LLR) values input into a decoder, and by reconstructing a derivative generator polynomial of a convolutional code, allows the decoder to output in serial according to a normal ordering of information bits during backtracking, that is, a first bit of an information sequence is first decoded successfully. Thus, CRC checking may be activated as soon as possible, so that part of the backtracking process and the CRC checking may be performed in parallel, thereby achieving the objective of reducing a processing time delay in decoding and checking the tail-biting convolutional code.

8 Claims, 3 Drawing Sheets

(51) Int. Cl.
*H03M 13/41* (2006.01)
*H03M 13/00* (2006.01)
*H04L 1/00* (2006.01)

(52) U.S. Cl.
CPC ........ *H03M 13/6525* (2013.01); *H04L 1/0059* (2013.01); *H04L 1/0061* (2013.01); *H04L 1/0054* (2013.01); *H04L 1/0071* (2013.01)

(56) References Cited

U.S. PATENT DOCUMENTS

| | | | |
|---|---|---|---|
| 7,852,962 B2* | 12/2010 | Gu et al. | 375/265 |
| 8,010,865 B2* | 8/2011 | Gu et al. | 714/752 |
| 8,627,171 B2* | 1/2014 | Pi | 714/758 |
| 2005/0041588 A1* | 2/2005 | Kim et al. | 370/236 |
| 2008/0184088 A1* | 7/2008 | Yang et al. | 714/755 |
| 2008/0209302 A1* | 8/2008 | Yang et al. | 714/755 |
| 2011/0280345 A1* | 11/2011 | Doan et al. | 375/341 |

OTHER PUBLICATIONS

English Translation of the Written Opinion of the International Search Authority in international application No. PCT/CN2011/080060, mailed on Nov. 3, 2011. (4 pages—see entire document).

* cited by examiner

METHOD AND APPARATUS FOR DECODING AND CHECKING TAIL-BITING CONVOLUTIONAL CODE

TECHNICAL FIELD

The disclosure relates to decoding and checking techniques, and in particular to a method and apparatus for decoding and checking a tail-biting convolutional code.

BACKGROUND

In a Long Term Evolution (LTE) system, each sub-frame (1 ms) of a downlink is divided into an earlier portion and a later portion according to time, wherein the earlier portion includes several Physical Downlink Control Channels (PDCCHs), and the later portion includes several Physical Downlink Shared Channels (PDSCHs). Wherein, the PDCCH bears Downlink Control Information (DCI), with which an evolved Node B (eNodeB) can notify a User Equipment (UE) of relevant control information and format information of each PDSCH in the sub-frame, such as a physical resource mapping location, a modulation mode, an encoding format and the like. Here, the eNB may also be referred to as a base station of the LTE system. For the UE, in order to demodulate PDSCH data, the PDCCH must be demodulated and decoded timely and correctly.

In the eNodeB of the LTE system, the PDCCH is modulated by Quadrature Phase Shift Keying (QPSK), with a tail-biting convolutional code as a forward error correction code. FIG. 1 is a flowchart of sending the DCI by the eNodeB in an existing LTE system. As can be seen from FIG. 1, when sending the DCI. S101: the eNodeB adds Cyclic Redundancy Check (CRC) check digits of 16 bits to the DCI. S102: and then goes through tail-biting convolutional encoding with a code rate of ⅓, S103: and then interleaving, S104: and then rate-matching, S105: and then is modulated, S106: and is then mapped onto physical resources, so as to implement sending of the DCI. Wherein, the physical resources refer to several specific sub-carriers. The eNodeB may send in one sub-frame a plurality of different DCI born on different PDCCHs, which PDCCHs are mapped on different physical resources, i.e., different Orthogonal Frequency Division Multiplexing (OFDM) symbols or different sub-carriers.

For the UE of the LTE system, the UE cannot fully know physical resources occupied by each PDCCH. However, according to relevant provisions of a protocol, there are several possible physical resource combinations, i.e., several combinations of data sub-carriers with specific locations, and the UE needs to perform blind demodulating and decoding on each of the physical resource combinations. For each of the physical resource combinations, as shown in FIG. 2. S201: the UE extracts a data signal on a corresponding physical resource by de-mapping OFDM symbols or sub-carriers. S202: and then demodulates the data signal extracted and obtains Log-Likelihood Ratios (LLR) by soft-decision. In order to improve efficiency and flexibility, the UE in the LTE do not fully know in advance the length and format of the DCI born by a specific PDCCH sent by the eNodeB: however, the UE may know that there are several possible lengths according to the protocol and a context. Thus, for each length. S203: the UE needs to perform de-rate-matching on the received and demodulated LLRs. S204: and then de-interleaving. S205: and then decode the tail-biting convolutional code. S206: and then perform CRC checking on decoded results. If the results pass the CRC checking, then the UE deems that one DCI is correctly received, and extracts and Interprets various commands of the eNodeB according to a format. Otherwise. If the results fall to pass the CRC checking, then the UE discards the decoded results directly, and continues to demodulate, decode and check other assumptions. Here, the other assumptions refer to different DCI lengths and formats and different physical resource combinations.

It can be seen from the above description that the UE needs to complete multiple times of demodulation and decoding within one sub-frame. According to analysis of the protocol and various scenarios, the UE needs to perform up to 44 times of demodulation, decoding and checking, wherein during a PDCCH blind detection, decoding and checking the tail-biting convolutional code takes up most of processing time.

Assuming that original DCI are $a_0, a_1, \ldots,$ and $a_{A-1}$, after the CRC checking, check digits of X bits are added as follows: $c_0, c_1, \ldots,$ and $c_{C-1}$, C=A+X, wherein X=16.

FIG. 3 is the block diagram of the structure of a tail-biting convolutional encoder in the prior art. As shown in FIG. 3, registers from left to right in FIG. 3 are $s_0, s_1, \ldots,$ and $s_5$, respectively, with initial values $s_i = c_{(C-1-i)}$, and the outputs of the three routes encoder are $d_k^0, d_k^1,$ and $d_k^2$.

FIG. 4 is a processing flowchart of decoding and checking the tail-biting convolutional code in the prior art. As show in FIG. 4, S401: after de-interleaving, the input of three routes of LLRs is $r_m(i)$, wherein m=0, 1, 2 and i=0, 1, ..., C−1. A traditional viterbi decoding algorithm is adopted for the tail-biting convolutional code, wherein the viterbi decoding algorithm is mainly divided into two main parts. i.e., forward searching and optimal path backtracking. S402: A process of decoding the tail-biting convolutional code is described below, which mainly includes the following steps:

Step 1: Initializing is performed;

specifically, there are six registers in the tail-biting convolutional code adopted by the LTE system, and 64 states need to be considered for a path in each decoding.

$M(i)=0$, wherein i=0, 1, ..., 63.

A generator formula of the convolutional code is rewritten into a form that is convenient to be executed by a decoder.

$$\text{Let } \overline{G}_{i,j} = \left(\sum_{k=0}^{4} S_{i,k} G_{j,k+1}\right) \bmod 2,$$

wherein i=0, 1, ..., 31 and j=0, 1, 2,
wherein $G_{j,k}$ represents a generator polynomial sequence of the convolutional code, for the convolutional code adopted by the LTE system, $G_{0,k}=\{1,0,1,1,0,1,1\}$, k=0, 1, ..., 6;
$G_{1,k}=\{1,1,1,1,0,0,1\}$, k=0, 1, ..., 6;
$G_{2,k}=\{1,1,1,0,1,0,1\}$, k=0, 1, ..., 6.

$S_{i,k}$ represents the value of the kth digit of a state variable i expressed as a binary value.

And let $g_{i,j}=1-2\overline{G}_{i,j}$, the value of $\overline{G}_{i,j}$ is $\{0, 1\}$, and the value of the corresponding $g_{i,j}$ is $\{1, -1\}$.

Step 2: Forward searching is performed;

specifically, it is assumed that searching is performed N steps forward. For the tail-biting convolutional code, N=3C.

Cycle 1: a counter n counts from 0 to N−1; and in each step, one by one for each state, a metric value is calculated, and an Add-Compare-Select operation is performed, for the specific process of which, Cycle 2 is referred to;

Cycle 2: for each count value j of a counter j (j=0, 1, ..., 31), $E=g_{j,0}r_0(n \bmod C)+g_{j,1}r_1(n \bmod C)+g_{j,2}r_2(n \bmod C)$ is calculated if $M(j)+E>M(j+32)-E,$  (1)

$\text{temp}M(2j)=M(j)+E$ and $P_{n,2j}=0,$ otherwise $\text{temp}M(2j)=M(j+32)-E$ and $P_{n,2j}=1;$ if $M(j)-E>M(j+32)+E,$  (2)

$\text{temp}M(2j+1)=M(j)-E$ and $P_{n,2j+1}=0,$ otherwise $\text{temp}M(2j+1)=M(j+32)+E$ and $P_{n,2j+1}=1;$ Cycle 2 for the counter j is ended.

After calculation for each state is completed, let $M(j)=\text{temp}M(j)$, wherein $j=0, 1, \ldots, 63$, and Cycle 1 for the counter n is ended.

Step 3: Optimal path backtracking is performed;

specifically, the largest metric value among M(j) is found and set as j*; optimal path backtracking will be started from a state j*, for the tail-biting convolutional code, the length of the backtracking is generally taken as twice an information length, i.e., 2C. Let $k(N-1)=j^*;$ Cycle 3: a counter i counts from N−1 to N−2C, and in each step:

if $P_{i,k(i)}=0$, then $$k(i-1) = \left\lfloor \frac{k(i)}{2} \right\rfloor,$$

otherwise $$k(i-1) = \left\lfloor \frac{k(i)}{2} \right\rfloor + 32$$

Cycle 3 for the counter i is ended.

S403: CRC checking is performed.

The decoded results are sorted according to a normal ordering, and are sent into a CRC module to calculate a check value.

The output decoded results are:

$y(i)=k(N-2C+i) \bmod 2$, wherein $i=0, 1, \ldots, C-1$

Through calculation, it is determined whether a CRC checking value is correct. If the CRC checking value is correct, then the DCI is reported, otherwise the present decoded results are discarded.

It can be seen from the above process of decoding and checking the tail-biting convolutional code in the prior art that the whole algorithm is completely a serial processing flow, and the backtracking operation can be started only after all forward searching are completed and an optimal path is acquired. Likewise, the CRC checking can be started only after the whole backtracking is completed, because CRC check calculation must start from the first information bit of a sequence while the backtracking operation cannot give the first bit until at the very end. Therefore, the CRC checking and the backtracking operation must be performed in serial. For a traditional method for decoding and checking the tail-biting convolutional code, the step of forward searching needs 3C processing time units, the backtracking needs 2C processing time units, and the CRC checking needs 1C processing time units; therefore, 6C processing time units are needed altogether.

In the above-mentioned LTE system, the UE needs to complete multiple times of decoding and checking of the tail-biting convolutional code. Within one sub-frame, the UE needs to acquire the DCI in the PDCCH as soon as possible, so as to perform demodulating and decoding of a subsequent PDSCH. In order to allow the subsequent PDSCH to obtain adequate time for demodulating and decoding, the system design of the UE puts a higher requirement on a time delay in demodulating and decoding the PDCCH. An improper design may greatly increase the expense of a parallel hardware for subsequent processing of the PDSCH, or lead to a data link failure due to a failure to process all PDSCH data timely.

SUMMARY

The disclosure provides a method and apparatus for decoding and checking a tail-biting convolutional code, so as to solve the problem of reducing a processing time delay in decoding and checking the tail-biting convolutional code in the prior art.

The technical solution of the disclosure includes:

A method for decoding and checking a tai-biting convolutional code by a processeor, including:

re-sorting M routes of log-likelihood ratios $r_m(i)$ obtained after de-interleaving to obtain $\bar{r}_m(i)$, wherein $\bar{r}_m(i)=r_m[(C-1-i+W) \bmod C]$, and inputting $\bar{r}_m(i)$ into a decoder, wherein $m=0, 1, M-1, i=0, 1, \ldots, C-1$, W represents a number of registers of the tail-biting convolutional code, and C represents an information bit length of the tail-biting convolutional code;

constructing a derivative sequence of a generator polynomial sequence of the tail-biting convolutional code, and performing forward path searching on the $\bar{r}_m(i)$ obtained after re-sorting, wherein the derivative sequence is an inverse sequence of the generator polynomial sequence of the tail-biting convolutional code; and performing optimal path backtracking on a path with a largest state metric value in the forward path searching to obtain results of decoding the tail-biting convolutional code, and activating Cyclic Redundancy Check (CRC) checking of the results of decoding the tail-biting convolutional code during the optimal path backtracking.

Moreover, the method may further include: reporting downlink control information obtained by decoding if the results of decoding the tail-biting convolutional code pass the CRC checking, otherwise discarding the results of decoding.

Moreover, the method may further include: when performing forward path searching on the $\bar{r}_m(i)$ obtained after re-sorting, in each step of counting, calculating a state metric value of each state one by one, and performing an Add-Compare-Select operation.

Moreover, the step of activating CRC checking of the results of decoding the tail-biting convolutional code during the optimal path backtracking may be:

activating the CRC checking of the results of decoding the tail-biting convolutional code when the process of the optimal path backtracking proceeds halfway.

Moreover, the M routes may be three routes.

Moreover, the number W of the registers may be six.

An apparatus for decoding and checking a tail-biting convolutional code includes: a log-likelihood ratio re-sorting module, a forward path searching module, an optimal path backtracking module, a checking module and a decoding result reporting module, wherein the log-likelihood ratio re-sorting module is configured to re-sort M routes of log-likelihood ratios $r_m(i)$ obtained after de-interleaving to obtain $\bar{r}_m(i)$, wherein $\bar{r}_m(i)=r_m[(C-1-i+W) \bmod C]$, and input $\bar{r}_m(i)$ into a decoder, wherein $m=0, 1, M-1, i=0, 1, \ldots, C-1$, W represents a number of registers of the tail-biting convolutional code, and C represents an information bit length of the tail-biting convolutional code;

the forward path searching module is configured to construct a derivative sequence of a generator polynomial sequence of the tail-biting convolutional code, and perform forward path searching on the $\bar{r}_m(i)$ obtained after re-sorting, wherein the derivative sequence is an inverse sequence of the generator polynomial sequence of the tail-biting convolutional code;

the optimal path backtracking module is configured to perform optimal path backtracking on a path with a largest state metric value in the forward path searching to obtain results of decoding the tail-biting convolutional code; and the checking module is configured to activate Cyclic Redundancy Check (CRC) checking of the results of decoding the tail-biting convolutional code during the optimal path backtracking.

Moreover, the apparatus may further include:

the decoding result reporting module configured to report results of decoding the tail-biting convolutional code that pass the CRC checking, and discard results of decoding the tail-biting convolutional code that fail to pass the CRC checking.

Moreover, the forward path searching module may be further configured to calculate, when performing the forward path searching on the $\bar{r}_m(i)$ obtained after re-sorting, in each step of counting, a state metric value of each state one by one, and perform an Add-Compare-Select operation.

Moreover, the checking module is specifically configured to, when activating CRC checking of the results of decoding the tail-biting convolutional code during the optimal path backtracking, activate the CRC checking of the results of decoding the tail-biting convolutional code when the process of the optimal path backtracking proceeds halfway.

The disclosure has the following beneficial effects:

The disclosure fully utilizes structural characteristics of the tail-biting convolutional code to re-sort Log-Likelihood Ratio (LLR) values input into a decoder, and by reconstructing a polynomial for generating a derivative tail-biting convolutional code, allows the decoder to output in serial according to a normal ordering of information bits during backtracking, that is, a first bit of an information sequence is first decoded successfully. Thus, CRC checking may be activated as soon as possible, so that part of the backtracking process and the CRC checking may be performed in parallel, thereby achieving the objective of reducing a processing time delay in decoding and checking.

With the technical solution of the disclosure, the forward searching needs 3C processing time units, the backtracking and the CRC checking need 2C processing time units, and therefore, 5C processing time units are needed altogether, whereas the traditional method needs 6C processing time units. The processing time delay of the method of the disclosure is reduced by 16.67%. Meanwhile, the disclosure merely changes an address calculation offset of a de-interleaver and a convolutional code generator formula in a decoding module, without the need to increase any hardware expense, belongs to an improvement of low cost, and does not cause any decoding performance downgrade. The disclosure is applicable, but is not limited, to decoding and checking the tail-biting convolutional code in the LTE system, and can be extended to be applicable to the process of decoding and checking any tail-biting convolutional code.

DETAILED DESCRIPTION

In order to further reduce the processing time for one-time decoding and checking of a tail-biting convolutional code, the disclosure fully utilizes structural characteristics of the tail-biting convolutional code, and provides a method and apparatus for decoding and checking the tail-biting convolutional code. The disclosure fully utilizes the structural features of the tail-biting convolutional code to re-sort Log-Likelihood Ratio (LLR) values input into a decoder, and by reconstructing a derivative generator polynomial of a convolutional code, allows the decoder to output in serial according to a normal ordering of information bits during backtracking, that is, a first bit of an information sequence is first decoded successfully. Thus, CRC checking may be activated as soon as possible, so that part of the backtracking process and the CRC checking may be performed in parallel, thereby achieving the objective of reducing a processing time delay in decoding and checking the tail-biting convolutional code.

Figure 1:
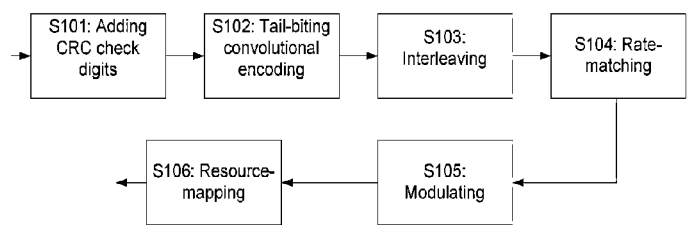
FIG. 1 is a flowchart of sending the DCI by the eNodeB in an existing LTE system.
Figure 2:
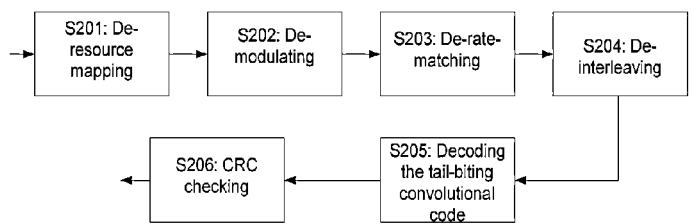
FIG. 2 is a flowchart of performing, by the UE, blind demodulation and decoding on each physical resource combination in an existing LTE system.
Figure 3:
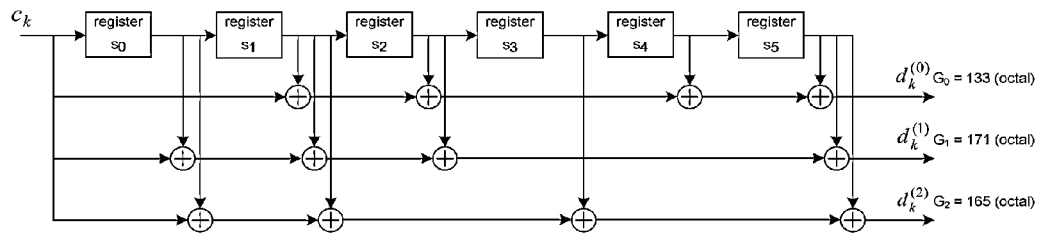
FIG. 3 is the block diagram of the structure of a tail-biting convolutional encoder in the prior art.
Figure 4:
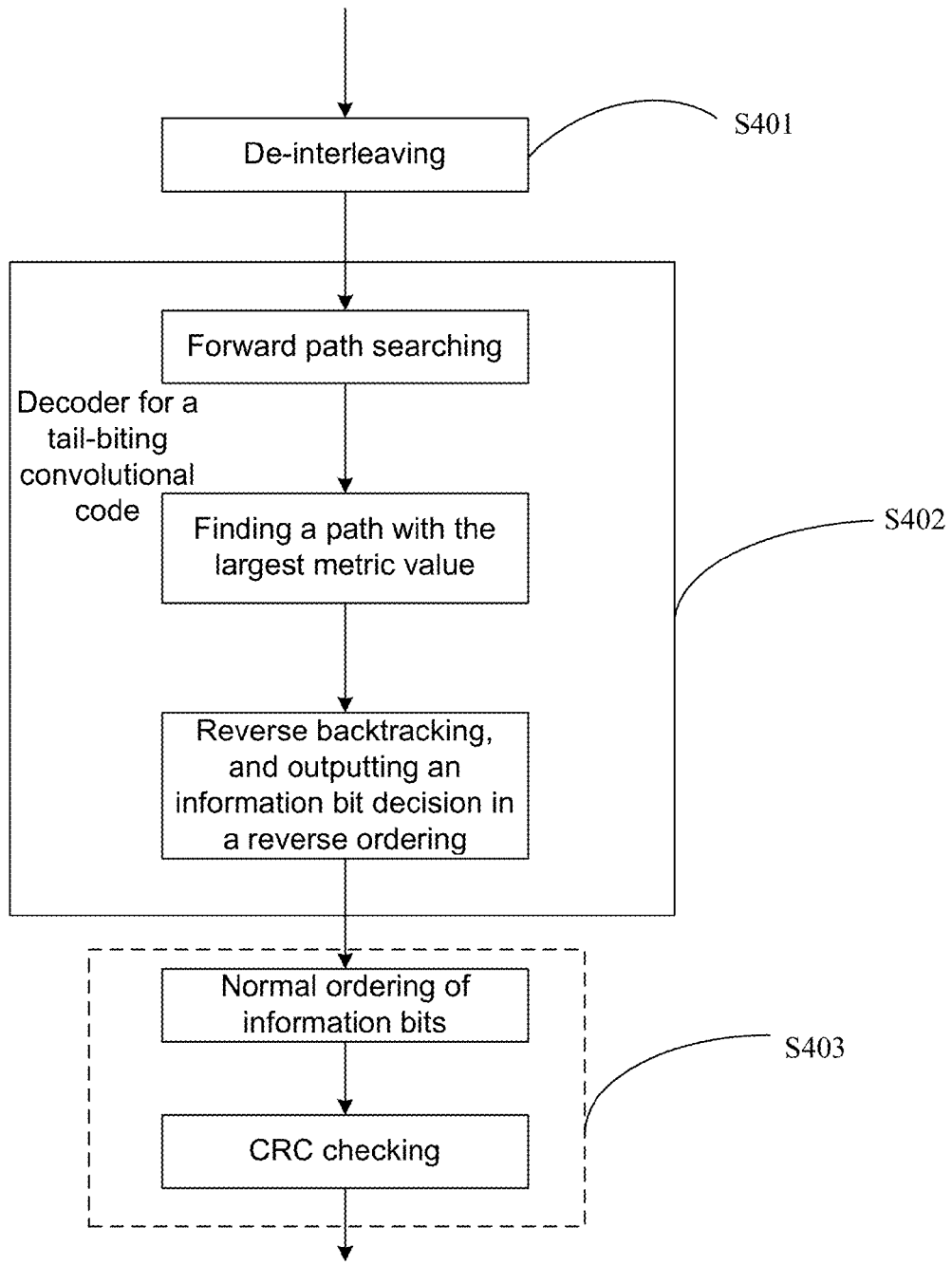
FIG. 4 is a processing flowchart of decoding and checking the tail-biting convolutional code in the prior art.
Figure 5:
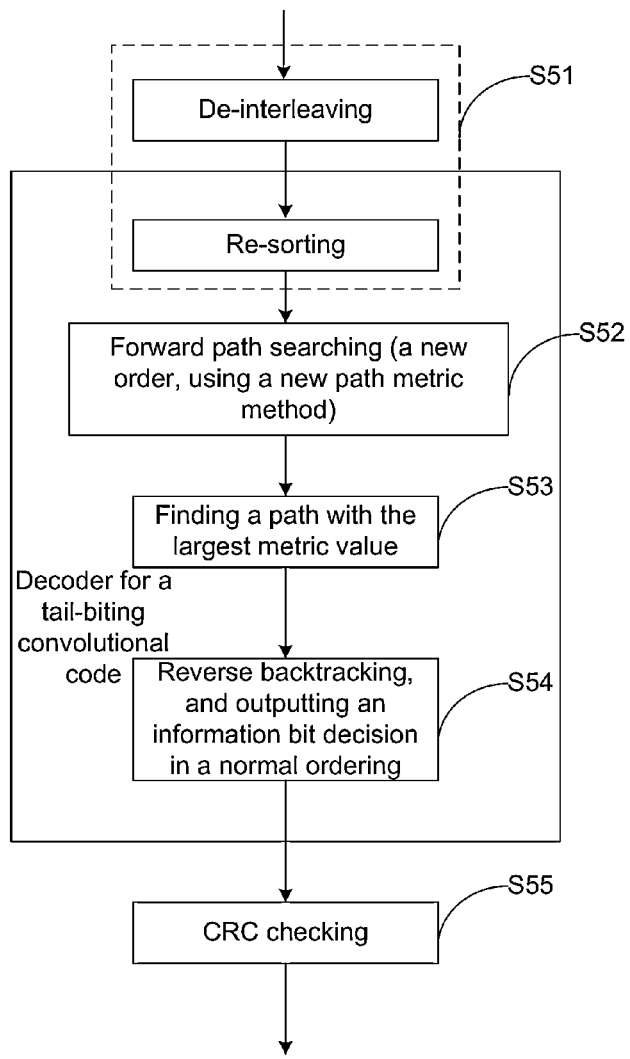
FIG. 5 is a schematic flowchart of a method for decoding and checking a tail-biting convolutional code according to the disclosure.

FIG. 5 is a flowchart of a method for decoding and checking a tail-biting convolutional code by a processor according to the disclosure. As shown in FIG. 5, the method mainly includes the following steps:

Step S51: M routes of LLR values $r_m(i)$ obtained by de-interleaving are re-sorted to obtain $\bar{r}_m(i)$, wherein $\bar{r}_m(i) = r_m[(C-1-i+W) \bmod C]$, and $\bar{r}_m(i)$ are input into a decoder, wherein m=0, 1, M-1, i=0, 1, . . . , C-1, W represents a number of registers of the tail-biting convolutional code, and C represents an information bit length of the tail-biting convolutional code;

Step S52: a derivative sequence of a generator polynomial sequence of the tail-biting convolutional code is constructed, and forward path searching is performed on the $\bar{r}_m(i)$ obtained after re-sorting, wherein the derivative sequence is an inverse sequence of the generator polynomial sequence of the tail-biting convolutional code;

Step S53: A path with a largest state metric value in the forward path searching is determined;

Step S54: Optimal path backtracking is performed on the path with the largest state metric value in the forward path searching to obtain results of decoding the tail-biting convolutional code; and Step S55: CRC checking of the results of decoding the tail-biting convolutional code is activated during the optimal path backtracking, decoded downlink control information is reported if the results of decoding the tail-biting convolutional code pass the CRC checking, otherwise the results of decoding are discarded.

A specific implementation process of the above method of the disclosure is further illustrated in detail below taking the LTE system as an example.

A process of decoding and checking the tail-biting convolutional code in the LTE system according to an embodiment of the disclosure mainly includes the following steps:

Step S61: De-interleaved LLR values are re-sorted;

here, it is assumed that, after de-interleaving, an input of three routes of LLR values is $r_m(i)$, wherein m=0, 1, 2, i=0, 1, ..., C−1, and C is an information bit length of the tail-biting convolutional code; and $r_m(i)$ are re-sorted to obtain $\bar{r}_m(i)$, wherein $\bar{r}_m(i)=r_m[(C-1-i+6) \bmod C]$, 6 in the expression represents the number of registers of the tail-biting convolutional code, m=0, 1, 2, and i=0, 1, ..., C−1.

The re-sorting operation in the step can be merged with the de-interleaving operation, and de-interleaving addresses are re-mapped according to the above expression when the de-interleaving addresses are generated. Therefore, the step does not cause any additional expense.

Step S62: Forward path searching are performed on the LLR values $\bar{r}_m(i)$ obtained after re-sorting, and this step specifically includes Sub-step S62A and Sub-step S62B, wherein Sub-step S62A: Initializing;

there are six registers in the tail-biting convolutional code adopted by the LTE system, and 64 states need to be considered for a path in each decoding.

M(i)=0, wherein i=0, 1, ..., 63.

A generator polynomial of the tail-biting convolutional code is rewritten into a form that is convenient to be executed by a decoder.

$$\text{Let } \bar{G}'_{i,j} = \left(\sum_{k=0}^{4} S_{i,k} G'_{j,k+1}\right) \bmod 2,$$

wherein i=0, 1, ..., 31 and j=0, 1, 2, wherein $G'_{j,k}$ represents a sequence derived from a generator polynomial sequence of the tail-biting convolutional code, wherein the sequence derived from a generator polynomial sequence of the tail-biting convolutional code is an inverse sequence of the generator polynomial sequence of the tail-biting convolutional code; and for the convolutional code adopted by the LTE system, $G'_{0,k}=\{1,0,1,1,0,1,1\}$, k=0, 1, ..., 6;
$G'_{1,k}=\{1,1,1,1,0,0,1\}$, k=0, 1, ..., 6;
$G'_{2,k}=\{1,0,1,0,1,1,1\}$, k=0, 1, ..., 6.

$S_{i,k}$ represents the value of the kth digit of a state variable i expressed as a binary value.

And let an intermediate variable $g'_{i,j}=1-2\bar{G}'_{i,j}$, the value of $g'_{i,j}=1-2\bar{G}_{i,j}$ is $\{0, 1\}$, and the value of the corresponding intermediate variable $g_{i,j}$ is $\{1, -1\}$.

Sub-step S62B: Forward path searching is performed.

Here, the specific implantation process of the forward path searching is identical with that of the prior art, what differs is the input.

It is assumed that searching is performed N steps forward. For the tail-biting convolutional code, N=3C.

Cycle 1: a counter n counts from 0 to N−1; and in each step, one by one for each state, a metric value is calculated, and an Add-Compare-Select operation is performed, for the specific process of which, Cycle 2 is referred to;

Cycle 2: for each count value j of a counter j (j=0, 1, ..., 31), $$E = g_{j,0} r_0(n \bmod C) + g_{j,1} r_1(n \bmod C) + g_{j,2} r_2(n \bmod C)$$

is calculated;

if $M(j)+E>M(j+32)-E$, (1)

$\text{temp}M(2j)=M(j)+E$ and $P_{n,2j}=0$, otherwise $\text{temp}M(2j)=M(j+32)-E$ and $P_{n,2j}=1$;

if $M(j)-E>M(j+32)+E$, (2)

$\text{temp}M(2j+1)=M(j)-E$ and $P_{n,2j+1}=0$, otherwise $\text{temp}M(2j+1)=M(j+32)+E$ and $P_{n,2j+1}=1$;

Cycle 2 for the counter j is ended.

After calculation for each state is completed, let $M(j)=\text{temp}M(j)$, wherein j=0, 1, ..., 63, and Cycle 1 for the counter n is ended.

Step S63: Optimal path backtracking and CRC checking are performed.

Specifically, the largest metric value among M(j) is found and set as j*; optimal path backtracking will be started from a state j*, for the tail-biting convolutional code, the length of backtracking is generally taken as twice an information length, i.e., 2C. Let k(N−1)=j*; the step specifically includes Sub-step S63A and Sub-step S63B, wherein Sub-step S63A:

Cycle 3: a counter i counts from N−1 to N−2C, and in each step: if $P_{i,k(i)}=0$, then $$k(i-1) = \left\lfloor \frac{k(i)}{2} \right\rfloor,$$

otherwise $$k(i-1) = \left\lfloor \frac{k(i)}{2} \right\rfloor + 32,$$

Cycle 3 for the counter i is ended.

Sub-step S63B:

Cycle 4: the counter i counts from N−1 to N−2C, and in each step:

if $P_{i,k(i)}=0$, then $$k(i-1) = \left\lfloor \frac{k(i)}{2} \right\rfloor,$$

otherwise $$k(i-1) = \left\lfloor \frac{k(i)}{2} \right\rfloor + 32.$$

Meanwhile, a decoding result y(N−C−1−i)=k(i)mod 2 can be output in each step, which result is input into a CRC module for calculation. Here, the first bit of the output decoding result is just y0.

Cycle 4 for the counter i is ended.

When Sub-step S63B is ended, CRC decoding results can be obtained promptly. If the CRC checking results are correct, then the DCI is reported, otherwise the decoding results are discarded.

Figure 6:
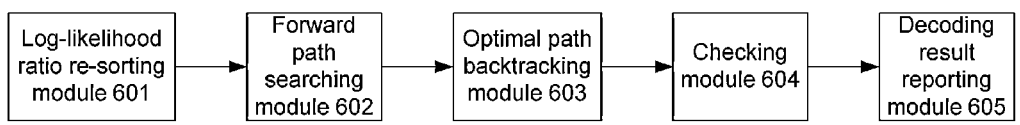
FIG. 6 is the block diagram of the structure of an apparatus for decoding and checking a tail-biting convolutional code according to the disclosure.

Corresponding to the above method of the disclosure, the disclosure further discloses an apparatus for decoding and checking a tail-biting convolutional code. FIG. 6 is the block diagram of the structure of the apparatus for decoding and checking a tail-biting convolutional code according to the disclosure. As shown in FIG. 6, the apparatus mainly includes: an LLR re-sorting module 601, a forward path searching module 602, an optimal path backtracking module 603, a checking module 604 and a decoding result reporting module 605, wherein the LLR re-sorting module 601 is configured to re-sort M routes of log-likelihood ratios $r_m(i)$ obtained by de-interleaving to obtain $r_m(i)$, wherein $\bar{r}_m(i)=r_m[(C-1-i+W) \bmod C]$, and input $r_m(i)$ into a decoder, wherein m=0, 1, M−1, i=0, 1, . . . , C−1, W represents a number of registers of the tail-biting convolutional code, and C represents an information bit length of the tail-biting convolutional code:

the forward path searching module 602 is configured to construct a derivative sequence of a generator polynomial sequence of the tail-biting convolutional code, and perform forward path searching on the $\bar{r}_m(i)$ obtained after re-sorting, wherein the derivative sequence is an inverse sequence of the generator polynomial sequence of the tail-biting convolutional code:

the optimal path backtracking module 603 is configured to perform optimal path backtracking on a path with a largest state metric value in the forward path searching to obtain results of decoding the tail-biting convolutional code:

the checking module 604 is configured to activate CRC checking of the results of decoding the tail-biting convolutional code during the optimal path backtracking; and the decoding result reporting module 605 is configured to report results of decoding the tail-biting convolutional code that pass the CRC checking, and discard results of decoding the tail-biting convolutional code that fail to pass the CRC checking.

Wherein, when performing the forward path searching on the $\bar{r}_m(i)$ obtained after re-sorting, the forward path searching module 602 calculates, in each step of counting, a state metric value of each state one by one, and performs an Add-Compare-Select operation; and the checking module 604 activates the CRC checking of the results of decoding the tail-biting convolutional code when the process of the optimal path backtracking proceeds halfway.

Please refer to the description of corresponding content in the above method of the disclosure for a specific operation process of the apparatus of the disclosure, which is not described here repeatedly.

Obviously, those skilled in the art can make various modifications and variations to the disclosure without departing from the spirit and scope of the disclosure. Thus, if these modifications and variations of the disclosure fall within the scope of the claims of the disclosure and equivalent technologies thereof, the disclosure is also intended to include these modifications and variants.

The invention claimed is:

1. A method for decoding and checking a tail-biting convolutional code by a processor, comprising:

re-sorting M routes of log-likelihood ratios $r_m(i)$ obtained after de-interleaving to obtain $\bar{r}_m(i)$, wherein $\bar{r}_m(i)= r_m[(C-1-i+W) \bmod C]$, and inputting $\bar{r}_m(i)$ into a decoder, wherein m=0, 1, M−1, i=0, 1, . . . , C−1, W represents a number of registers of the tail-biting convolutional code, and C represents an information bit length of the tail-biting convolutional code;

constructing a derivative sequence of a generator polynomial sequence of the tail-biting convolutional code, and performing forward path searching on the $\bar{r}_m(i)$ obtained after re-sorting, wherein the derivative sequence is an inverse sequence of the generator polynomial sequence of the tail-biting convolutional code; and performing optimal path backtracking on a path with a largest state metric value in the forward path searching to obtain results of decoding the tail-biting convolutional code, and activating Cyclic Redundancy Check (CRC) checking of the results of decoding the tail-biting convolutional code during the optimal path backtracking;

the method further comprising: reporting downlink control information obtained by decoding if the results of decoding the tail-biting convolutional code pass the CRC checking, otherwise discarding the results of decoding.

2. The method according to claim 1, wherein the step of performing forward path searching on the $\bar{r}_m(i)$ obtained after re-sorting comprises:

when searching is performed N steps forward, a counter counts from 0 to N−1, wherein N=3C;

in each step of counting, calculating a state metric value of each state one by one by the decoder, and performing an Add-Compare-Select operation by the decoder.

3. The method according to claim 1, wherein the step of activating CRC checking of the results of decoding the tail-biting convolutional code during the optimal path backtracking is:

activating the CRC checking of the results of decoding the tail-biting convolutional code when the process of the optimal path backtracking proceeds halfway.

4. The method according to claim 1, wherein the M routes of log-likelihood ratios are three routes of log-likelihood ratios.

5. The method according to claim 1, wherein the number W of the registers is six.

6. An apparatus for decoding and checking a tail-biting convolutional code, implemented by a processor, comprising: a log-likelihood ratio re-sorting module, a forward path searching module, an optimal path backtracking module, a checking module and a decoding result reporting module, wherein the log-likelihood ratio re-sorting module is configured to re-sort M routes of log-likelihood ratios $r_m(i)$ obtained after de-interleaving to obtain $\bar{r}_m(i)$, wherein $\bar{r}_m(i)= r_m[(C-1-i+W) \bmod C]$, and input $\bar{r}_m(i)$ into a decoder, wherein m=0, 1, M−1, i=0, 1, . . . , C−1, W represents a number of registers of the tail-biting convolutional code, and C represents an information bit length of the tail-biting convolutional code;

the forward path searching module is configured to construct a derivative sequence of a generator polynomial sequence of the tail-biting convolutional code, and perform forward path searching on the $\bar{r}_m(i)$ obtained after re-sorting, wherein the derivative sequence is an inverse sequence of the generator polynomial sequence of the tail-biting convolutional code;

the optimal path backtracking module is configured to perform optimal path backtracking on a path with a largest state metric value in the forward path searching to obtain results of decoding the tail-biting convolutional code;

the checking module is configured to activate Cyclic Redundancy Check (CRC) checking of the results of decoding the tail-biting convolutional code during the optimal path backtracking; and the decoding result reporting module configured to report results of decoding the tail-biting convolutional code that pass the CRC checking, and discard results of decoding the tail-biting convolutional code that fail to pass the CRC checking;

wherein the log-likelihood ratio re-sorting module, the forward path searching module, the optimal path backtracking module, the checking module and the decoding result reporting module are each the result of execution on a processor of software stored in a memory of the apparatus.

7. The apparatus according to claim 6, wherein the forward path searching module is further configured to calculate, when searching is performed N steps forward and a counter counts from 0 to N−1, in each step of counting, a state metric value of each state one by one by the decoder, and perform an Add-Compare-Select operation by the decoder, wherein N=3C.

8. The apparatus according to claim 6, wherein the checking module is configured to, when activating CRC checking of the results of decoding the tail-biting convolutional code during the optimal path backtracking, activate the CRC checking of the results of decoding the tail-biting convolutional code when the process of the optimal path backtracking proceeds halfway.

* * * * *